(12) United States Patent
Khemka et al.

(10) Patent No.: US 7,777,257 B2
(45) Date of Patent: Aug. 17, 2010

(54) BIPOLAR SCHOTTKY DIODE AND METHOD

(75) Inventors: Vishnu K. Khemka, Phoenix, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 11/674,886

(22) Filed: Feb. 14, 2007

(65) Prior Publication Data

US 2008/0191305 A1    Aug. 14, 2008

(51) Int. Cl.
 *H01L 29/317* (2006.01)
 *H01L 21/42* (2006.01)
(52) U.S. Cl. .............. 257/281; 257/260; 257/335; 257/337; 257/341; 257/476; 438/170; 438/534; 438/571
(58) Field of Classification Search .......... 257/337
See application file for complete search history.

(56) References Cited

U.S. PATENT DOCUMENTS

| | | | | |
|---|---|---|---|---|
| 5,365,102 A | * | 11/1994 | Mehrotra et al. | 257/475 |
| 5,502,326 A | * | 3/1996 | Slotboom et al. | 257/530 |
| 5,689,144 A | * | 11/1997 | Williams | 307/130 |
| 5,753,938 A | * | 5/1998 | Thapar et al. | 257/77 |
| 5,818,084 A | * | 10/1998 | Williams et al. | 257/329 |
| 6,297,534 B1 | * | 10/2001 | Kawaguchi et al. | 257/341 |

(Continued)

FOREIGN PATENT DOCUMENTS

EP     1233456 A2    8/2002

OTHER PUBLICATIONS

Khemka, V., et al, A Fully Planarized 4H-SiC Trench MOS Barrier Schottky (TMBS) Rectifer, IEEE Electron Device Letters, vol. 21, No. 5, May 2000.

(Continued)

*Primary Examiner*—Charles D Garber
*Assistant Examiner*—Pape Sene
(74) *Attorney, Agent, or Firm*—Ingrassia, Fisher & Lorenz, P.C.

(57) ABSTRACT

A low leakage bipolar Schottky diode (20, 40, 87) is formed by parallel lightly doped N (32, 52, 103) and P (22, 42, 100) regions adapted to form superjunction regions. First ends of the P regions (22, 42, 100) are terminated by P+ layers (21, 41, 121) and second, opposed ends of the N regions (32, 52, 103) are terminated by N+ layers (31, 51, 131). Silicide layers (24, 34, 44, 54, 134, 124) are provided in contact with both ends of the parallel N and P regions (22, 32, 42, 52, 100, 103), thereby forming at the first end ohmic contacts (28, 48) with the P+ regions (21, 41, 121) and Schottky contacts (37, 57) with the N regions 32, 52, 103) and at the second, opposite end, ohmic contacts (38, 58) with the N+ regions (31, 51, 131) and Schottky contacts (27, 47) with the P regions (22, 42, 100). When forward biased current flows in both N (32, 52) and P (22, 42) regions thereby reducing the forward drop. When reverse biased, a substantial portion of the voltage is dropped across the lightly doped N (32, 52) and P (22, 42) superjunction regions, thereby significantly reducing the reverse leakage.

20 Claims, 6 Drawing Sheets

U.S. PATENT DOCUMENTS

| | | | |
|---|---|---|---|
| 6,313,482 B1 * | 11/2001 | Baliga | 257/77 |
| 6,512,268 B1 * | 1/2003 | Ueno | 257/341 |
| 6,576,935 B2 * | 6/2003 | Onishi et al. | 257/124 |
| 6,611,021 B1 * | 8/2003 | Onishi et al. | 257/328 |
| 6,673,679 B1 * | 1/2004 | Miyasaka et al. | 438/268 |
| 6,693,323 B2 * | 2/2004 | Sato et al. | 257/341 |
| 6,743,703 B2 | 6/2004 | Rodov et al. | |
| 6,787,420 B2 * | 9/2004 | Miyasaka et al. | 438/268 |
| 6,815,766 B2 * | 11/2004 | Miyasaka et al. | 257/329 |
| 6,873,012 B2 * | 3/2005 | Stecher et al. | 257/347 |
| 7,071,518 B2 | 7/2006 | Parthasarathy et al. | |
| 7,355,124 B2 * | 4/2008 | Ikumo et al. | 174/255 |
| 7,510,938 B2 * | 3/2009 | de Fresart | 438/273 |
| 7,605,446 B2 * | 10/2009 | Udrea et al. | 257/565 |
| 2003/0190789 A1 * | 10/2003 | Salama et al. | 438/286 |
| 2005/0242411 A1 | 11/2005 | Tso | |
| 2006/0001057 A1 | 1/2006 | Khemka et al. | |
| 2006/0202254 A1 * | 9/2006 | Lai et al. | 257/315 |

OTHER PUBLICATIONS

Nunes, B., et al., "No Cost" Reduced-Leakage Schottky Diode by Ion Implantation, IEEE/SEMi Advanced Semiconductor Manufacturing Conference, 1999.

Severt, Clarence, et al., Design of Dual Use, High Efficiency, 4-H-SIC Schottky and MPS Diodes, AIAA-2000-2829.

Shimizu, T., et al., 100V Trench MOS Barrier Schottky Rectifier Using Thick Oxide Layer (TO-TMBS), Proceedings of 2001 International Symposium on Power Semiconductor Devices & ICs, Osaka.

Napoli, E., Design consideration of 1000V merged PiN Schottky diode using superjunction sustaining layer, Proceedings of 2001 International Symposium on Power Semiconductor Devices & ICs, Osaka.

Fujhira, T., Theory of Semiconductor Superjunction Devices, Jpn. J. Appl Phys. vol. 36 (1997) pp. 6254-6262 Part. 1, No. 10, Oct. 1997.

Zhu, L., et al., Design of High Voltage 4H-SiC Superjunction Schottky Rectifers, International Journal of High Speed Electronics and Systems vol. 14, No. 3, 2004, 865-871.

Kunori, S., et al., 120V Multi RESURF Junction Barrier Schottky Rectifier (MR-JBS) ISPSD 2002 pp. 97-100.

\* cited by examiner

BIPOLAR SCHOTTKY DIODE AND METHOD

FIELD OF THE INVENTION

The present invention generally relates to semiconductor devices and methods for fabricating semiconductor devices, and more particularly relates to Schottky diodes.

BACKGROUND OF THE INVENTION

Schottky diodes are familiar semiconductor devices formed, typically, by a metal-semiconductor junction. Persons of skill in the art understand that the "metal" used in forming the Schottky diode or junction may be other than a pure metal and may also be an alloy or mixture of various metals and/or semi-metals, as for examples and not intended to be limiting, silicides of a wide variety of metals. Accordingly, the terms "metal" and "silicide" as used herein are intended to include such variations and other suitable conductors. A wide variety of semiconductors can be used in forming Schottky diodes, such as for example and not intended to be limiting, types IV, III-V and II-VI semiconductors, organic semiconductors, and layered devices such as semiconductor-on-insulator (SOI) devices. Accordingly, the term "semiconductor" is intended to include these and other materials suitable for forming Schottky diodes.

The Schottky diode is generally thought of as a majority carrier device since carrier recombination is ordinarily not involved in its operation. Compared to ordinary PN junction diodes, Schottky diodes have very low forward drop and fast switching speed, which makes them very useful in a number of familiar applications. However, their usefulness is often limited because, when reverse biased, the leakage current is relatively high and increases rapidly with increasing voltage. This makes it difficult to achieve Schottky diodes with high breakdown voltages using ordinary semiconductor materials. Despite the advantages of low forward drop and very fast switching speeds, Schottky diodes often cannot be employed in applications where their higher reverse leakage currents can degrade overall circuit performance.

Accordingly, it is desirable to provide a new type of Schottky diode with improved reverse characteristics, and more particularly, a Schottky diode suitable for operation at higher voltages and with lower leakage at a given voltage than has been achievable in the prior art for the same semiconductor materials. In addition, it is desirable to provide a structure and method for fabricating Schottky diodes in very thin epitaxial layers suitable for use with complex power devices and/or integrated circuits and especially with state of the art Smart Power technologies. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
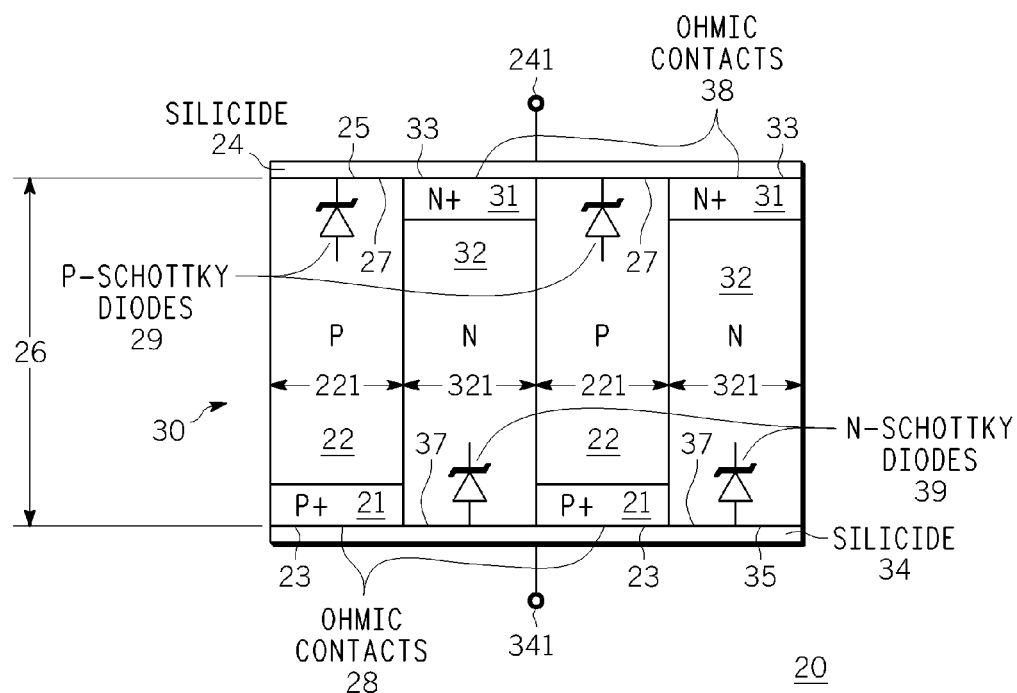
FIG. 1 is a simplified schematic cross-sectional view through a Schottky diode according to an embodiment of the invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down, " "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

FIG. 1 is a simplified schematic cross-sectional view through Schottky diode 20 according to an embodiment of the invention. Diode 20 comprises semiconductor body 30 in which are formed alternate pillars or layers of P type semiconductor 22 and N type semiconductor 32 with widths 221 and 321, respectively, chosen so as to provide multi-resurf or superjunction (SJ) action. Silicon is a non-limiting example of a suitable semiconductor material but many others, such as for example and not intended to be limiting, those listed above, may also be used. The criteria for adjacent P and N regions to act as multi-resurf or superjunction structures are well known in the art and are described, for example, in "Theory of Semiconductor Superjunction Devices", T. Fujihira, Jpn. J. Appl. Phys., Vol. 36, pp. 6254-6262, October 1997. The alternate P and N type columns or layers 22, 32 conveniently have substantially equal widths or thicknesses 221, 321 usefully in the range of about 0.1 to 5.0 micrometers, more conveniently about 0.5 to 2.0 micrometers and preferably about 0.5 to 1.0 micrometers. Length 26 perpendicular to widths or thicknesses 221, 321 are usefully in the range of about 0.1 to 20.0 micro-meters, more conveniently about 0.5 to 10 micrometers and preferably about 1.0 to 5.0 micrometers, but larger or smaller lengths can be used depending upon the reverse voltage which the diodes must withstand. Suitable doping levels for regions 22 and 32 are for example and not intended to be limiting, in the range of about $5E16$ cm$^{-3}$ to $5E17$ cm$^{-3}$ for P type region 22 and in the range of about $5E16$ cm$^{-3}$ to $5E17$ cm$^{-3}$ for N type region 32. Silicide layer 24, of for example and not intended to be limiting, cobalt silicide (Co:Si) is provided on surface 25 of semiconductor body 30 and silicide layer 34 of the same or different material, is provided on surface 35 of semiconductor body 30. Platinum silicide (Pt:Si) and titanium silicide (Ti:Si) are non-limiting examples of other useful materials, but any metal or semi-metal capable of forming a Schottky barrier with the particular semiconductor of interest, can also be used. As used herein, the term "silicide" is intended to include these and other Schottky contact forming materials. Silicide layers 24, 34 can be formed of the same or different materials and have the same or different thicknesses. Silicide layers 24, 34 are usefully about 0.05 to 0.2 micro-meters thick, but larger or smaller thicknesses can also be used. P type regions 22 have P+ regions 21 adjacent silicide layer 34. P+ regions 21 form ohmic contacts 28 with portions 23 of silicide layer 34. N type regions 32 have N+ regions 31 adjacent silicide layer 24. N+ regions 31 form ohmic contacts 38 with portions 33 of silicide layer 24. P type regions 22 form Schottky contacts 27 with silicide layer 24, thereby forming Schottky diodes 29. N type regions 32 form Schottky contacts 37 with silicide layer 34 thereby forming Schottky diodes 39. Contact electrodes 241 and 341 are coupled to silicide layers 24 and 34 respectively. Electrode 341 is the anode and electrode 241 is the cathode of device 20. These may be external electrodes or be coupled to other devices in an integrated circuit or Smart Power device or circuit. When device 20 is reverse biased, the adjacent pillars are substantially depleted of majority carriers, thereby substantially spreading the applied voltage drop along length 26 of pillars or layers 22, 32, which in turn, reduces the reverse voltage drop appearing across Schottky diodes 29, 39. Thus, the reverse bias leakage of device 20 is much reduced compared to a prior art device of the same area but without alternate P and N type pillars or layers 22, 32. At the same time, the forward resistance of device 20 is the same or less than that of a prior art device of the same area but without alternate pillars or layers 22, 32. One of the reasons that the invented device can have lower forward resistance is that length 26 can be made shorter for the same breakdown voltage, so that the forward drop is reduced. Thus, invented device 20 provides improved reverse bias characteristics without any area penalty or increase in forward resistance. This combination of properties is a significant improvement over the prior art.

Figure 2:
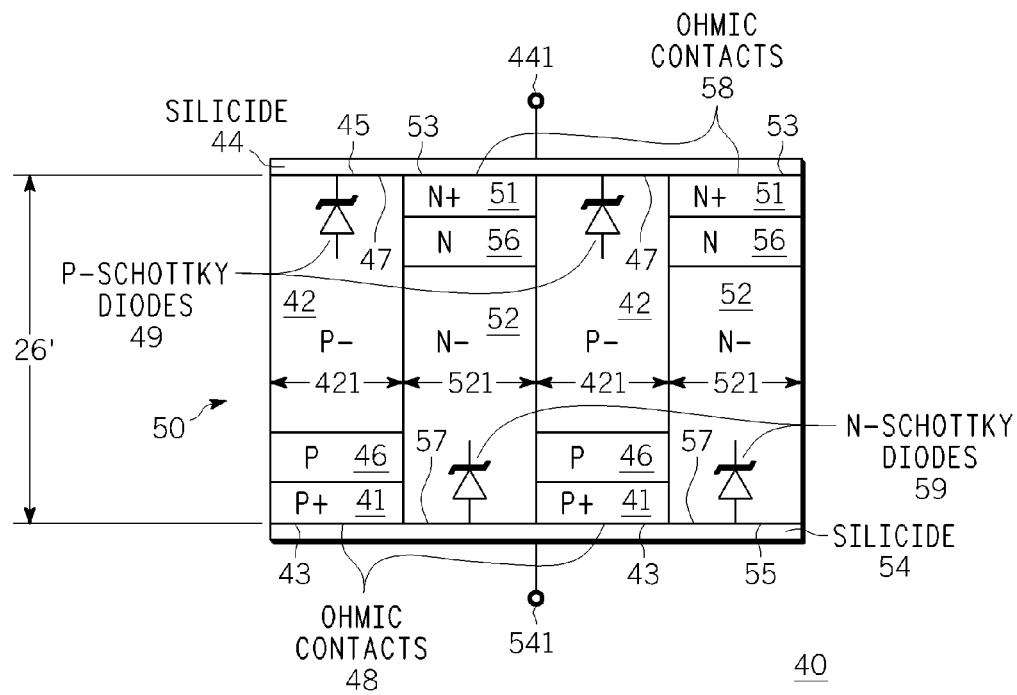
FIG. 2 is a simplified schematic cross-sectional view through a Schottky diode according to a further embodiment of the invention.

FIG. 2 is a simplified schematic cross-sectional view through Schottky diode 40 according to a further embodiment of the invention. Diode 40 comprises semiconductor body 50 in which are formed alternate pillars or layers of P-type semiconductor regions 42 and N-type semiconductor regions 52 with widths 421 and 521, respectively, chosen so as to provide multi-resurf or superjunction (SJ) action. The criteria for adjacent P and N regions 22, 32 of device 20 to act as multi-resurf or superjunction structures, as described in connection with device 20 of FIG. 1, also apply to P– and N– regions 42, 52 of device 40 and are incorporated herein by reference. Suitable doping levels for regions P– regions 42 and N– regions 52 are, for example and not intended to be limiting, in the range of about $5E16$ cm$^{-3}$ to $5E17$ cm$^{-3}$ for P– region 42 and in the range of about $5E16$ cm$^{-3}$ to $5E17$ cm$^{-3}$ for N– region 52. Device 40 also has P type region 46 between P– region 42 and P+ region 41, and N type region 56 between N– region 52 and N+ region 51. Regions 46, 56 should be doped to a concentration greater than regions 42, 52 but less than P+, N+ regions 43, 53. About ten times the doping of regions 42, 52 is preferred for regions 46, 56, respectively, but higher or lower doping levels may be used that satisfy the criteria that the doping of regions 46, 56, respectively, be higher than that of regions 42, 52, respectively, but lower than that of regions 41, 51, respectively. Stated another way, it is desirable that regions 46, 56 be doped in the range of about $1E17$ cm$^{-3}$ to $5E18$ cm$^{-3}$. Silicide layer 44, of for example and not intended to be limiting, the same types of materials used in connection with layer 24 of device 20 is provided on surface 45 of semiconductor body 50 and silicide layer 54 of, for example and not intended to be limiting, the same types of materials used in connection with layer 34 of device 20 is provided on surface 55 of semiconductor body 50. P type regions 46 have P+ regions 41 adjacent to portions 43 of silicide layer 54, thereby forming ohmic contacts 48 therewith. N type regions 56 have N+ regions 51 adjacent portions 53 of silicide layer 44, thereby forming ohmic contacts 58 therewith. P– regions 42 form Schottky contacts 47 with silicide layer 44, thereby forming Schottky diodes 49. N– regions 52 form Schottky contacts 57 with silicide layer 54 thereby forming Schottky diodes 59. Reducing the doping density of P– region 42 and N– region 52 in contact with silicide layers 44 and 54 respectively, provides a pinch effect to pin the electric field at Schottky contacts 47 and 57, respectively, thereby further improving the reverse bias properties of device 40 compared to the prior art. Contact electrodes 441 and 541 are coupled to silicide layers 44 and 54 respectively. These may be external electrodes or be coupled to other devices in an integrated circuit or Smart Power device or circuit.

When device 40 is reverse biased, the adjacent P– and N– pillars are substantially depleted of majority carriers, thereby substantially spreading the applied voltage drop along length 26' of pillars or layers 42, 52, and pinning the electric field at Schottky junctions 47, 57. This combination further reduces the voltage drop appearing across Schottky diodes 49, 59. Thus, the reverse bias leakage observed with device 40 is even further reduced compared to a prior art device of the same area but without alternate P and N type pillars or layers 42, 52 and inclusion of P and N regions 46, 56 respectively. At the same time, the forward resistance of device 40 is the same or less than that of a prior art device of the same area but without alternate pillars or layers 42, 52. As previously noted in connection with device 20 of FIG. 1, the fact that length 26' can be made shorter while still allowing device 40 to achieve the same breakdown voltage as a prior art device also permits the forward drop of the invented device to be reduced. Thus, invented device 40 provides improved reverse bias characteristics without any area penalty or increase in forward resistance. This combination of properties is a significant improvement over the prior art.

It will be noted that devices 20 and 40 are bipolar devices in the sense that both electrons and holes function as majority carriers in the N and P type pillars, respectively, and participate in the Schottky diode action. In the invented devices, both N and P type pillars carry current when the device is in forward conduction. This is unlike prior art devices, even those in which superjunction (SJ) pillars may have been used to improve reverse characteristics. In the prior art, only one type of pillar carries forward current. Thus, to obtain the same low forward resistance or forward voltage drop, the prior art device area had to be increased to maintain the same forward conduction properties. The invented devices described herein avoid this difficulty by enabling forward conduction in both P and N pillars while obtaining the improvement in reverse characteristics from the use of parallel superjunction P and N regions.

Figure 3:
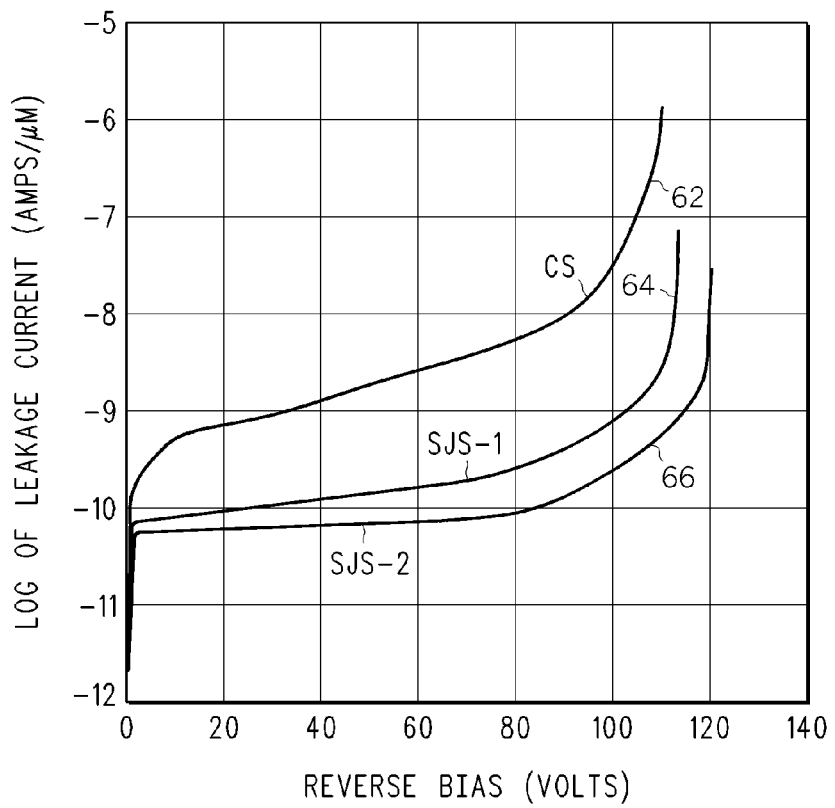
FIG. 3 is a log plot of the reverse current of Schottky diodes according to several embodiments of the invention illustrated in FIGS. 1-2 compared to a conventional prior art Schottky diode of substantially the same active area.

FIG. 3 shows plot 60 of the log of the reverse current of Schottky diodes according to several embodiments of the invention illustrated in FIGS. 1-2, compared to a conventional prior art Schottky diode of the same active area. Trace 62 illustrates the reverse bias behavior of a conventional Schottky (CS) diode, identified by the label ("CS"). Trace 64 shows the reverse bias behavior of superjunction Schottky (SJS) diode 20 of the type illustrated in FIG. 1, identified by the label ("SJS-1"). Trace 66 shows the reverse bias behavior of superjunction Schottky (SJS) diode 40 of the type illustrated in FIG. 2 identified by the label ("SJS-2"). It will be noted that the reverse bias leakage current is much reduced in invented devices SJS-1 (trace 64) and SJS-2 (trace 66) compared to conventional Schottky (CS) diode (trace 62). For example, at 100 volts reverse bias, the invented structures show reverse leakage that is 1.5 to 2 orders of magnitude lower than the conventional Schottky diode of the prior art.

Figure 4:
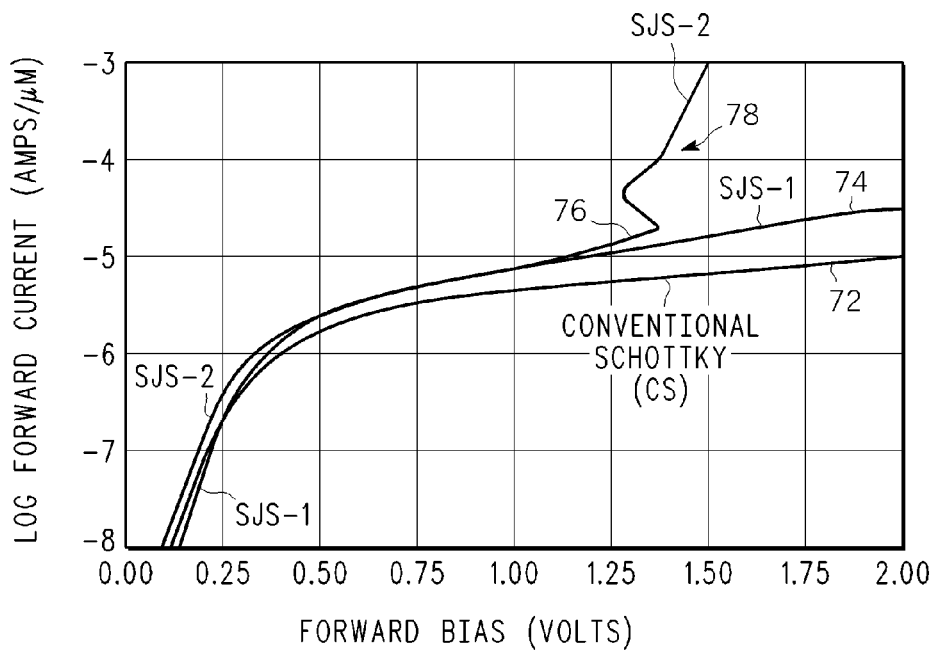
FIG. 4 is a log plot of the forward current of Schottky diodes according to several embodiments of the invention illustrated in FIGS. 1-2 compared to a conventional prior art Schottky diode of substantially the same active area.

FIG. 4 shows plot 70 of the log of the forward current of Schottky diodes according to several embodiments of the invention illustrated in FIGS. 1-2 compared to a conventional prior art Schottky diode of the same active area. Trace 72 illustrates the forward conduction behavior of a conventional Schottky (CS) diode, identified by the label ("CS"). Trace 74 shows the forward conduction behavior of superjunction Schottky (SJS) diode 20 of the type illustrated in FIG. 1, identified by the label ("SJS-1"). Trace 76 shows the forward conduction behavior of superjunction Schottky (SJS) diode 40 of the type illustrated in FIG. 2 identified by the label ("SJS-2"). It will be noted that the forward conduction current is larger in invented devices SJS-1 (trace 74) and SJS-2 (trace 76) compared to conventional Schottky (CS) diode (trace 72) at the same voltage, indicating that the forward resistance is lower. For example, at 1.0 volts forward bias, the invented structures shows forward current that is about twice the forward current of the conventional prior art Schottky diode at the same voltage, indicating that the forward resistance has been about cut in half. This is a significant improvement, over the prior art especially when coupled with the improved reverse bias characteristics. It will be noted that for SJS-2 (trace 76) in region 78 at voltages above about 1.3 volts forward bias, that a snap-back, thyristor-like action occurs, further improving the forward characteristics. This is an unexpected result, providing several orders of magnitude reduction in forward resistance at such forward voltages. This improvement is not obtained in prior art Schottky diodes.

FIGS. 5-12 illustrate schematically, in isometric and cross-sectional view, manufacturing stages 80-87 in accordance with still further embodiments of the invention for fabricating the semiconductor device of FIGS. 1 and/or 2. For brevity, many conventional steps will only be mentioned briefly herein or will be omitted entirely without providing the well known process details. For example, while many masking steps are used in the course of fabrication of the devices, the result of the masking step is depicted rather than the mask itself. Persons of skill in the art understand how to provide masks having the geometries indicated in the various manufacturing stages. Hard masks or soft masks may be used, depending upon the capabilities of the particular fabrication line being used to create the Schottky diodes and whether other devices are being simultaneously fabricated on the same substrate to form an integrated circuit or Smart Power device or both. Structures 800-870 result from manufacturing stages 80-87 respectively. The discussion of the various regions that make up devices 20, 40 in FIGS. 1-2 and the relative doping types and doping concentration of such regions are included herein by reference and FIGS. 5-12 should be considered in conjunction with FIGS. 1-2. The manufacturing stages of FIGS. 5-12 are, for convenience of explanation and not intended to be limiting, described for a planar device where current flow is substantially in the plane of the substrate, but this is not intended to be limiting and persons of skill in the art will understand based on the description herein how to form devices in which current flow is in other directions.

Figure 5:
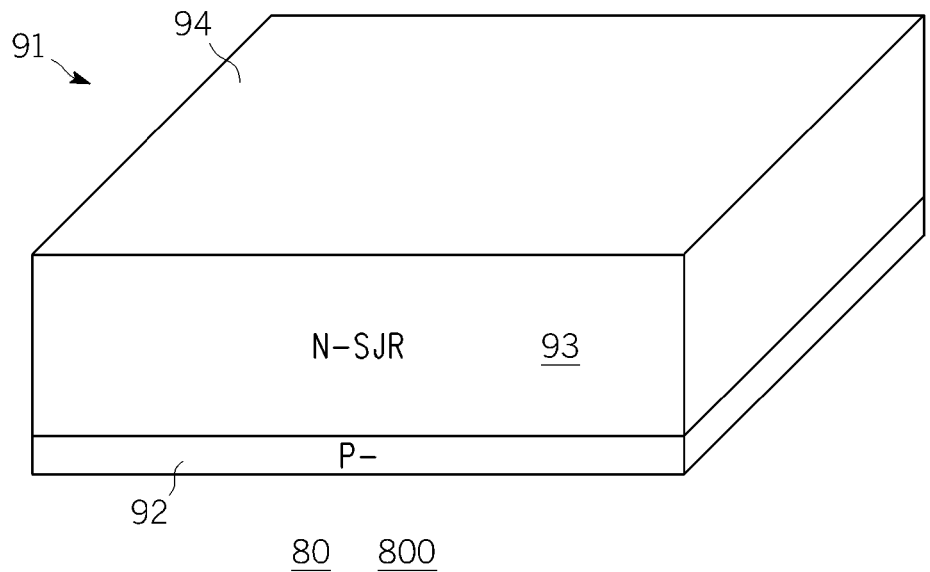
FIGS. 5-12 illustrate schematically, in isometric and cross-sectional view, method stages accordance with still further embodiments of the invention for fabricating Schottky diodes of the type illustrated in FIGS. 1-2.

Referring now to manufacturing stage 80 of FIG. 5, supporting substrate 91 having surface 94 is provided. Substrate 91 may be a semiconductor of, for example and not intended to be limiting, silicon or other type IV or III-V or II-VI or organic semiconductor or combinations thereof, and may be in the form of a single crystal or polycrystalline or of a layer that has been formed on another substrate. Silicon-on-insulator (SOI) is a non-limiting example of such an alternative structure. For convenience of description, it is assumed herein the substrate 91 includes P-type buried layer (PBL) 92 underlying N-type superjunction layer or region (N-SJR) 93, analogous to regions 32, 52 of FIGS. 1-2, extending to surface 94. N-SJR 93 is desirably N doped in the range of about 5E16 $cm^{-3}$ to 5E17 $cm^{-3}$. P-type buried layer 92 is convenient but not essential to the present invention. N-SJR 93 may be formed by epitaxial growth on layer 92 or by implant or other type of doping of substrate 91. In a preferred embodiment, P−substrate 91 is provided and N-SJR 93 is formed in P− substrate 91 by ion implantation to a depth of about 2 micrometers so that the remaining underlying portion of substrate 91 forms PBL 92. But this is not essential and any arrangement for obtaining resulting structure 800 of FIG. 5 may be used. In manufacturing stage 81 of FIG. 6, shallow, spaced apart, dielectric isolation regions 96, 98 of widths 97, 99 respectively, are formed in surface 94. Isolation regions 96, 98 conveniently extend into substrate 91 to depth 95 of conveniently, about 0.1 to 1.0 micrometers from surface 94 and are useful for preventing the silicide that will be subsequently applied to various parts of surface 94 from shorting out certain regions of surface 94 where significant voltage drop occurs. Structure 810 results.

Figure 6:
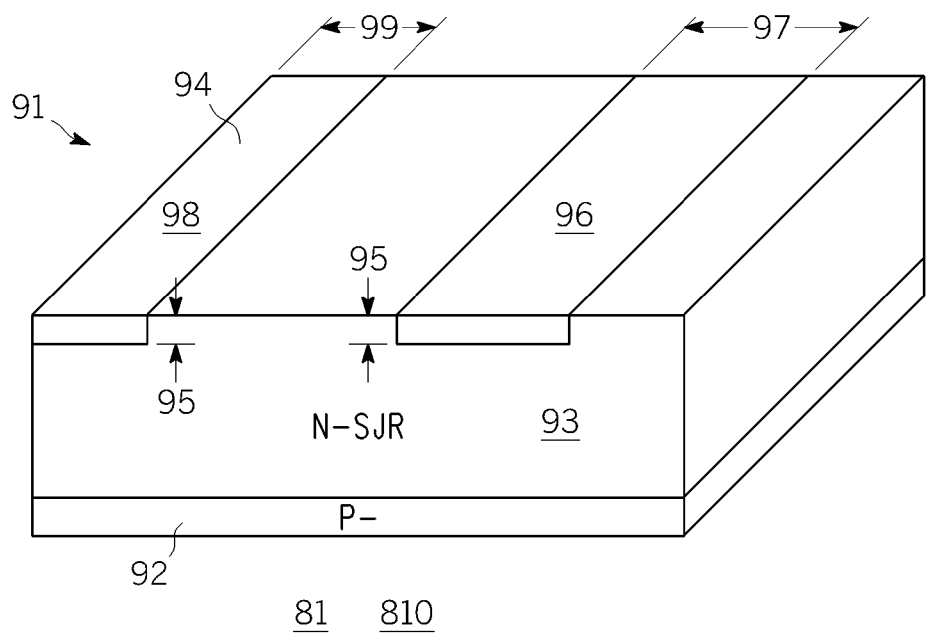
Figure 7:
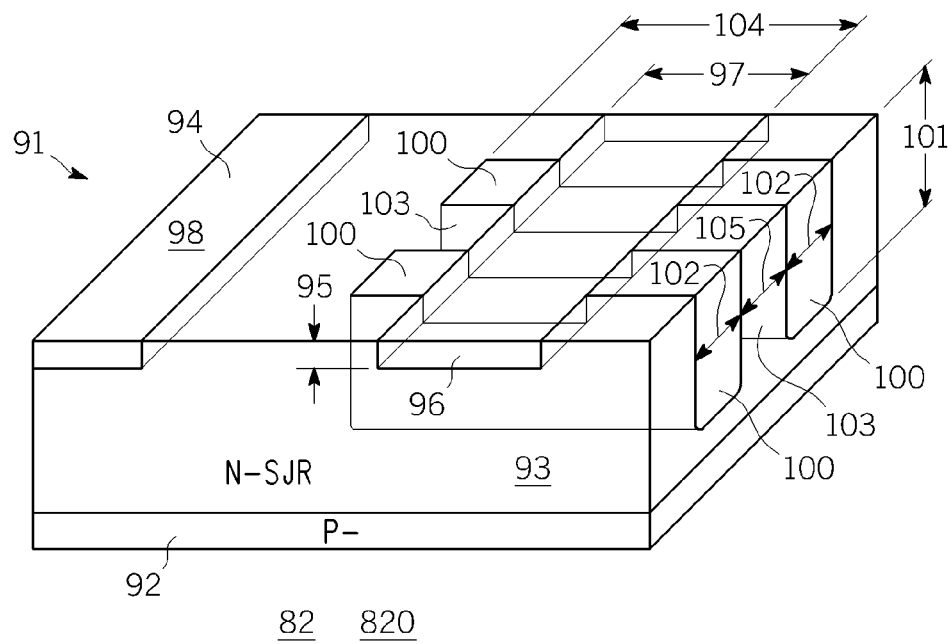

In manufacturing stage 82 of FIG. 7, structure 810 of FIG. 6 is masked and P-type dopant implanted (or otherwise introduced) and annealed to provide substantially parallel, multiple P-type superjunction regions (P-SJRs) 100, extending into N-SJR 93 of substrate 91 to depth 101 less than the thickness of N-SJR 93. To facilitate understanding, some light-weight lines are included within substrate 91 to indicate the three dimensional shape of P-SJRs 100 and their spatial relation to shallow isolation regions 96, 98. P-SJRs 100 have widths 102, separations 105 and lengths 104 extending leftward from the right hand edge of isolation region 96. The portion of regions 100 to the right of isolation region 96 are used for making electrical contacts to regions 100. Thus, substantially parallel P-SJRs 100 are spaced apart by region N regions 103 of N-SJR 93. P-SJRs 100 are desirably doped about in the same range as N-SJRs 103 derived from N-SJR 93, but higher or lower doping can also be used provided that the criteria needed for superjunction action are satisfied. The substantially parallel, spaced apart, P and N regions formed by P-SJRs 100 and N-SJRs 103 give rise to the desired superjunction action described in connection with devices 20, 40 of FIGS. 1-2 and widths 102 and separations 105 are chosen to facilitate this condition. The discussion of how to choose the doping, size and spacing of multiple adjacent doped regions to obtain superjunction action provided in connection with FIGS. 1 and 2 is incorporated herein by reference. Lengths 97 and 104 are chosen depending upon the reverse voltage that the resulting Schottky diode will experience, the higher the reverse voltage the greater lengths 97, 104. Depth 101 and widths 102, 105 are chosen based on the desired forward resistance, keeping in mind the need to always satisfy the superjunction behavior criteria with respect to width 102 and 105 of the P and N SJRs. Other things being equal, the lower the desired forward resistance, the greater depth 101. Depth 101 is controlled in general by the maximum implant energy used in forming doped regions 100. Persons of skill in the art will understand based on the description herein how to choose lengths 97, 104 and depth 101 depending upon their particular application. In general it is desirable that length 104 exceeds width or length 97 and that P-SJRs 100 extend laterally on either side of dielectric isolation region 96, as is illustrated in FIG. 7. Structure 820 results.

Figure 8:
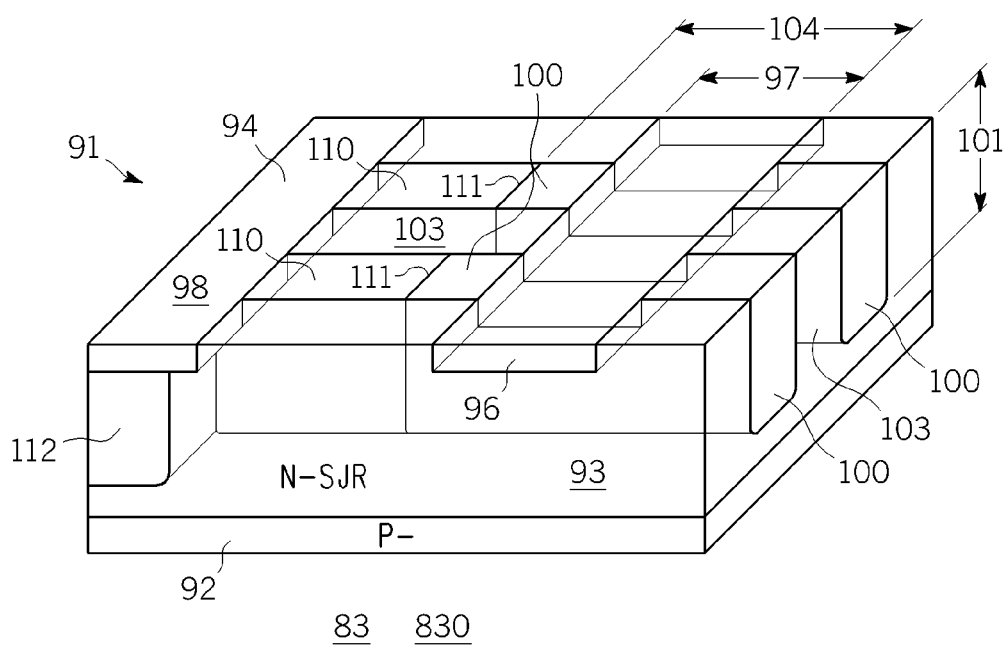

In manufacturing stage 83 of FIG. 8, structure 820 is masked and a further P-type ion implantation (or other doping action) carried out to provide P-type body regions (P-BRs) 110, 112. Regions 110 are desirably aligned with and of the same width, depth and spacing as P-SJRs 100, but of a heavier doping. P-BRs 110 make electrical contact with P-SJRs 100 at interfaces 111. P-BRs 110 are analogous to regions 46 of device 40 of FIG. 2, and the same doping criteria as described for regions 46 apply to regions 110. At the same time as P-BRs 110 are being formed, e.g., by ion implantation and anneal, body region 112 is also desirably provided underlying shallow dielectric isolation region 98. It conveniently has about the same doping and depth as P-SJRs 100. To facilitate understanding, some light-weight lines are included within substrate 91 to indicate the three dimensional shape of P-SJRs 100 and P-BRs 110, 112, and their spatial relation to shallow isolation regions 96, 98 and each other. It will be noted that P-BRs 100 extend underneath isolation region 98 so as to contact P-BR 112. In this way, P-BR 112 electrically couples the ends of multiple P-SJRs 100. These particular light-weight lines are omitted in subsequent figures to avoid unnecessary clutter. Structure 830 results.

Figure 9:
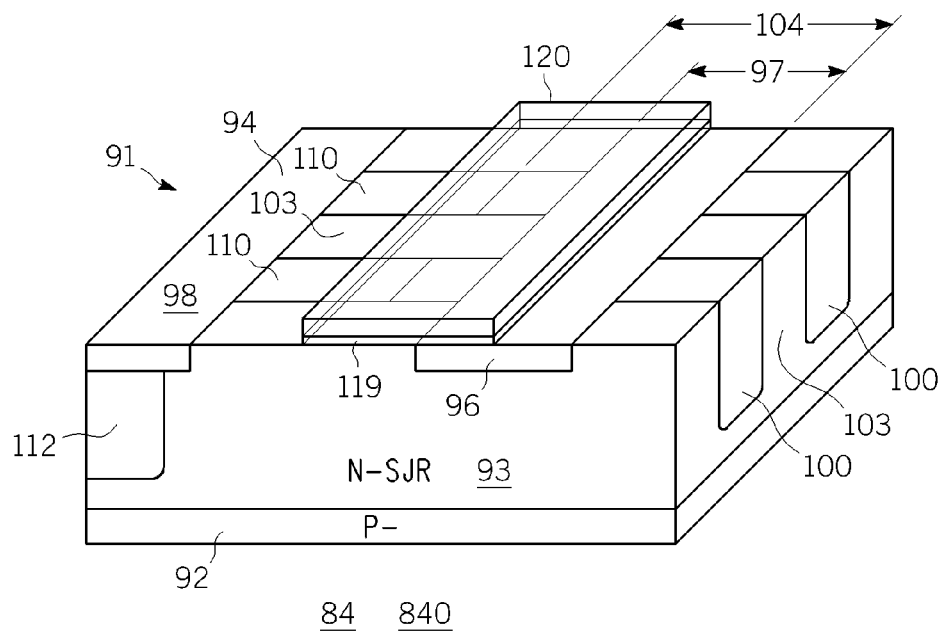

In manufacturing stage 84 of FIG. 9, conductor layer (e.g., heavily doped polysilicon) 120 is provided over a portion of surface 94 of substrate 91 above P-SJRs 100 and N-SJRs 103. It is separated from surface 94 by dielectric layer 119, similar to the gate dielectric of a MOSFET. Conductor layer 120 (and underlying dielectric layer 119) extends from dielectric isolation region 96 over surface 94 toward P-BRs 110. Conductor layer 120 (and underlying dielectric layer 119) desirably partly overlaps P-BRs 110 to minimize the build-up of electric field at the edge of shallow dielectric region 96. Conductor layer 120 is desirable but not essential. While doped polysilicon is a preferred material for conductor layer 120, any conductive material may be used. Non-limiting examples are conductive semiconductors, semimetals, metals, organic materials and combinations thereof. Structure 840 results.

Figure 10:
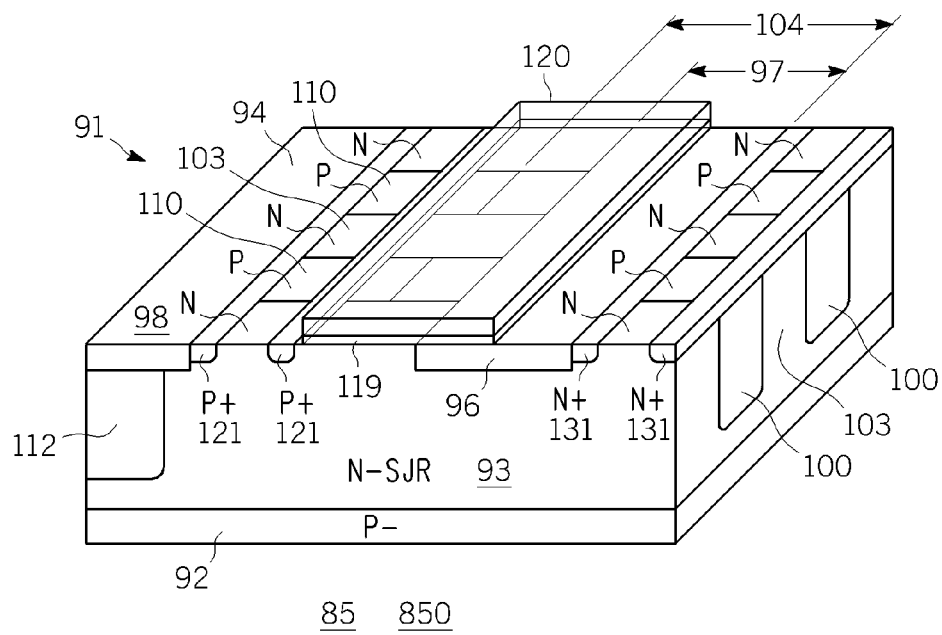

In manufacturing stage 85 of FIG. 10, P+ contact regions 121 are provided on surface 94 of substrate 91 across P-BRs 110 and intervening N-SJRs 103 adjacent dielectric isolation region 98, and N+ contact regions 131 are provided on surface 94 of substrate 91 across P-SJRs 100 and intervening N-SJRs 103 adjacent dielectric isolation region 96. P+ regions 121 make ohmic contact to P-BRs 110 and rectifying contacts to N-SJRs 103. In this respect P+ regions 121 correspond to P+ regions 21 of FIGS. 1 and 2. The rectifying contacts to N-SJRs 103 are not necessary electrically but facilitate manufacturing. It is much easier to form one or more stripe-shaped P+ regions 121 oriented at right angles to length 104 and contacting both P and N regions 110, 103 than to mask N-SJRs 103 so that the P+ only intersects the P-BRs 110. Similarly, N+ contact regions 131 make ohmic contact to N-SJRs 103 and rectifying contacts to P-SJRs 100. In this respect N+ regions 131 correspond to N+ regions 31 of FIGS. 1 and 2. The rectifying contacts to P-SJRs 100 are not necessary electrically but facilitate manufacturing. It is much easier to form one or more stripe-shaped N+ regions 131 oriented at right angles to length 104 and contacting both P and N regions 100, 103 than to mask P-SJRs 100 so that the N+ only intersects the N-SJRs 103. Structure 850 results.

Figure 11:
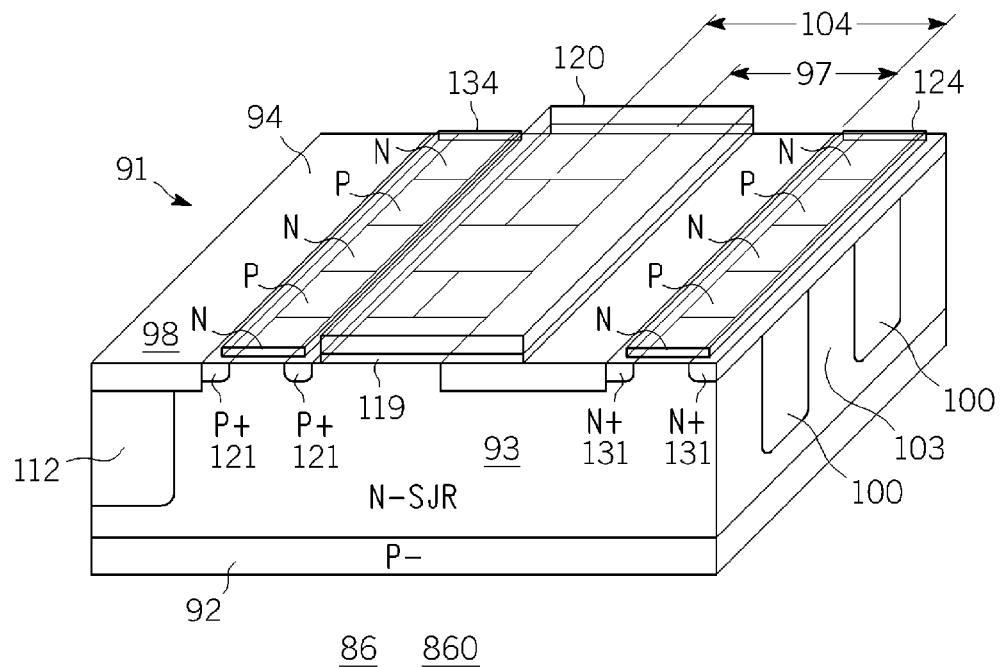
Figure 12:
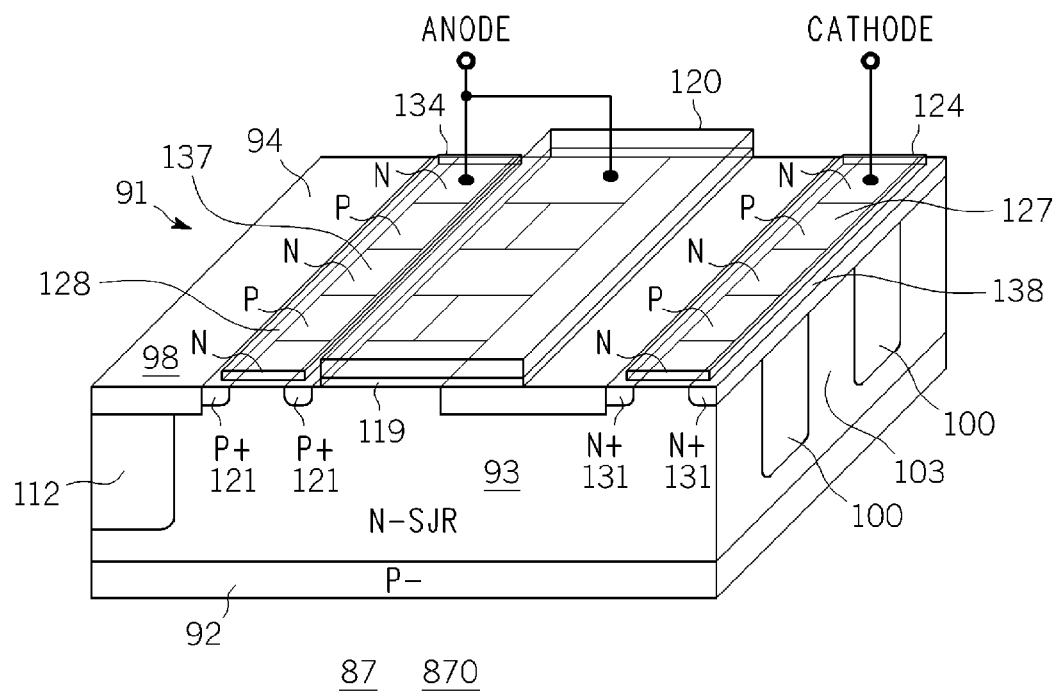

In manufacturing stage 86 of FIG. 11, silicide contacts 124, 134 are provided overlying and making contact with the N+ and P+ contact region and the N-SJRs and P-BRs in between. Contact 124 is analogous to contact 24, 44 of FIGS. 1-2 and contact 134 is analogous to contact 34, 54 of FIGS. 1-2. Contact 124 overlies N+ regions 131 and forms an ohmic contact 138 therewith, in the same manner as silicide layer 24, 44 forms an ohmic contact 38, 58 with N+ region 31, 51 of FIGS. 1-2. Contact 124 also overlies P-SJRs 100 and N-SJRs 103. Contact 124 makes a Schottky barrier contact 127 to P-SJRs 100, in the same manner as silicide layer 24, 34 forms a Schottky contact 27, 47 with P region 22, 42 of FIGS. 1-2. The fact that contact 124 makes a rather poor ohmic contact to N-SJRs 103 is irrelevant, since a low resistance ohmic contact formed to N+ regions 131 is in parallel. Contact 134 also overlies P-BRs 110 and N-SJRs 103. Contact 134 makes a Schottky barrier contact 137 to N-SJRs 103, in the same manner as silicide layer 34, 54 forms a Schottky contact 37, 57 with N region 32, 52 of FIGS. 1-2. The fact that contact 134 makes a rather poor ohmic contact to P-BRs 110 is irrelevant, since a low resistance ohmic contact formed to P+ regions 121 is in parallel. Contact 134 also forms an ohmic contact 128 with P+ region 121, in the same manner as silicide layer 34, 54 forms an ohmic contact 28, 48 with P+ region 21, 41 of FIGS. 1-2. Structure 860 results. In manufacturing stage 87 of FIG. 12, anode and cathode electrodes are provided. Structure 870 results. It will be noted that manufacturing stages 80-87 provide the equivalent of region 46 in the equivalent of P-columns or layers 42 of FIG. 2, but not the equivalent of region 56 in the equivalent of N columns or layers 52 of FIG. 2. However, persons of skill in the art will understand that the equivalent of region 56 may be included by providing an additional masking step and implantation. Conversely, the equivalent of device 20 of FIG. 1 may be obtained by omitting the masking step used for implanting regions 110, and increasing the length of the original P implant for forming P-SJRs 100 to extend to dielectric isolation region 48. Either arrangement is useful. Thus, substantially the same structure as has been illustrated in FIGS. 1-2 can be formed in a planar arrangement by manufacturing stages 80-87 and variations thereon described herein.

According to a first embodiment, there is provided a bipolar Schottky diode, comprising, multiple parallel N– and P– regions adapted to form one or more superjunctions therein, wherein the multiple parallel N– and P– regions each have first ends and opposed second ends, P+ regions terminating the first end of each P– region, N+ regions terminating the second end of each N– region, a first conductive region on the first ends, forming ohmic contacts with the P+ regions and Schottky contacts with the N− regions, and a second conductive region on the second ends, forming ohmic contacts with the N+ regions and Schottky contacts with the P− regions. According to a further embodiment, the P− and N− regions have a dopant concentration in the range of 5E16 cm$^{-3}$ to 5E17 cm$^{-3}$. According to a still further embodiment, the diode further comprises a third conductive region overlying and insulated from a portion of the multiple parallel N− and P− regions. According to a yet further embodiment, the diode further comprises a further P region of dopant concentration intermediate between the dopant concentrations of the P− and P+ regions, located between the P− and P+ regions. According to a yet still further embodiment, the further P region has a dopant concentration of about ten times a dopant concentration of the P− region. According to an additional embodiment, the diode further comprises a further N region of dopant concentration intermediate between dopant concentrations of the N− and N+ regions, located between the N− and N+ regions. According to a still additional embodiment, the further N region has a dopant concentration of about ten times a dopant concentration of the N− region. According to a yet additional embodiment, the first and second conductive layers comprise a silicide. According to a still yet additional embodiment, the silicide comprises Co:Si or Pt:Si or Ti:Si or combinations thereof.

According to a second embodiment, there is provided a method for forming a bipolar Schottky diode, comprising, providing a semiconductor body of a first conductivity type having a first surface, forming substantially parallel, spaced-apart regions of a second, opposite, conductivity type in the semiconductor body with substantially parallel spaced-apart portions of the semiconductor body intervening therebetween, so that, a combination of the spaced-apart regions and portions form one or more superjunctions therein, the spaced-apart portions and regions having first ends and second ends, providing highly doped first contact regions of the first conductivity type at the first ends of the spaced-apart portions, providing highly doped second contact regions of the second conductivity type at the second ends of the spaced-apart regions, providing a first conductive layer on the first ends of the portions and regions, adapted to form ohmic contacts with the highly doped first contact regions and Schottky contacts with the spaced-apart regions, and providing a second conductive layer on the second ends of the portions and regions, adapted to form ohmic contacts with the highly doped second contact regions and Schottky contacts with the spaced-apart portions. According to a further embodiment, the method further comprises providing further regions of the first conductivity type located between the spaced-apart portions and the highly doped first contact regions, wherein the further regions have a doping concentration intermediate between doping concentrations of the first portions and the highly doped first contact regions. According to a still further embodiment, the method further comprises providing still further regions of the second conductivity type located between the spaced-apart regions and the highly doped second contact regions, wherein the still further regions have a doping concentration intermediate between doping concentrations of the first regions and the highly doped second contact regions. According to a yet further embodiment, the semiconductor body has a dopant concentration in the range of about 5E16 cm$^{-3}$ to 5E17 cm$^{-3}$. According to a still yet further embodiment, the method further comprises forming a further conductor layer, insulated from and overlying part of the substantially parallel, spaced-apart regions and portions. According to a yet still further embodiment, the method further comprises electrically coupling the further conductor layer to the first or second conductor layer. According to an additional embodiment, the first conductivity type is P type and the second, opposite conductivity type is N type.

According to a third embodiment, there is provided a semiconductor device, comprising, multiple parallel relatively lightly doped alternating semiconductor regions of first and second, opposite, conductivity types, respectively, adapted to form one or more superjunctions therein, wherein the multiple parallel regions have first ends and opposed second ends, relatively highly doped layers of the first conductivity type terminating the first ends of the multiple parallel regions of the first conductivity type, relatively highly doped layers of the second, opposite, conductivity type terminating the second ends of the multiple parallel regions of the second conductivity type, a first conductive layer on the first ends, forming ohmic contacts with the relatively highly doped layers of the first conductivity type and Schottky contacts with the relatively lightly doped regions of the second, opposite conductivity type, and a second conductive layer on the second ends, forming ohmic contacts with the relatively highly doped layers of the second, opposite, conductivity type and Schottky contacts with the relatively lightly doped regions of the first conductivity type. According to a further embodiment, the multiple parallel relatively lightly doped alternating regions of first and second, opposite, conductivity types, have impurity concentrations in the range of about 5E16 cm$^{-3}$ to 5E17 cm$^{-3}$. According to a still further embodiment, the device further comprises a region of the same conductivity type and doping intermediate to that of the relatively lightly doped regions and the relatively heavily doped layers, interspersed between the relatively lightly doped regions and the relatively heavily doped layers. According to a yet further embodiment, the semiconductor comprises silicon and the first and second conductive layers comprise silicide.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A bipolar Schottky diode, comprising:

multiple parallel N− regions and multiple parallel P− regions in an alternating arrangement and adapted to form one or more superjunctions therein, wherein the multiple parallel N− regions have first ends and opposed second ends, and the multiple parallel P− regions have first ends that are co-planar with the first ends of the N− regions and opposed second ends that are co-planar with the second ends of the N− regions;

P+ regions terminating the first end of each P− region;

N+ regions terminating the second end of each N− region;

a first contact overlying the first ends and in direct contact with the P+ regions and the N− regions, the first contact forming ohmic contacts with the P+ regions and Schottky contacts with the N− regions; and a second contact overlying the second ends and in direct contact with the N+ regions and the P− regions, the second contact forming ohmic contacts with the N+ regions and Schottky contacts with the P− regions, wherein the N− regions and the P− regions each are adapted to carry forward current when the bipolar Schottky diode is in forward conduction.

2. The diode of claim 1, wherein the P− and N− regions have a dopant concentration in the range of 5E16 cm$^{-3}$ to 5E17 cm$^{-3}$.

3. The diode of claim 1, further comprising a third contact overlying and insulated from a portion of the multiple parallel N− and P− regions.

4. The diode of claim 1, further comprising a further P region of dopant concentration intermediate between the dopant concentrations of the P− and P+ regions, located between the P− and P+ regions.

5. The diode of claim 4, wherein the further P region has a dopant concentration of about ten times a dopant concentration of the P− region.

6. The diode of claim 1, further comprising a further N region of dopant concentration intermediate between dopant concentrations of the N− and N+ regions, located between the N− and N+ regions.

7. The diode of claim 6, wherein the further N region has a dopant concentration of about ten times a dopant concentration of the N− region.

8. The diode of claim 1, wherein the first and second contacts comprise a silicide.

9. The diode of claim 8, wherein the silicide comprises Co:Si or Pt:Si or Ti:Si or combinations thereof.

10. A method for forming a bipolar Schottky diode, comprising:
providing a semiconductor body of a first conductivity type having a first surface;
forming substantially parallel, spaced-apart regions of a second, opposite, conductivity type in the semiconductor body with substantially parallel, spaced-apart portions of the semiconductor body intervening therebetween, so that, a combination of the spaced-apart regions and the spaced-apart portions form one or more super-junctions therein, the spaced-apart portions having first ends and opposed second ends, and the spaced-apart regions having first ends that are co-planar with the first ends of the spaced-apart portions and opposed second ends that are co-planar with the second ends of the spaced-apart portions;
providing highly doped first contact regions of the first conductivity type at the first ends of the spaced-apart portions;
providing highly doped second contact regions of the second conductivity type at the second ends of the spaced-apart regions;
providing a first conductive layer in direct contact with the highly doped first contact regions at the first ends of the spaced-apart portions and with the first ends of the spaced-apart regions, wherein the first conductive layer is adapted to form ohmic contacts with the highly doped first contact regions and Schottky contacts with the spaced-apart regions; and
providing a second conductive layer in direct contact with the second ends of the spaced-apart portions and with the highly doped second contact regions at the second ends of the spaced-apart regions, wherein the second conductive layer is adapted to form ohmic contacts with the highly doped second contact regions and Schottky contacts with the spaced-apart portions, wherein the spaced-apart portions and the spaced-apart regions each are adapted to carry forward current when the bipolar Schottky diode is in forward conduction.

11. The method of claim 10, further comprising:
providing further regions of the first conductivity type located between the spaced-apart portions and the highly doped first contact regions, wherein the further regions have a doping concentration intermediate between doping concentrations of the spaced-apart portions and the highly doped first contact regions.

12. The method of claim 10, further comprising providing still further regions of the second conductivity type located between the spaced-apart regions and the highly doped second contact regions, wherein the still further regions have a doping concentration intermediate between doping concentrations of the first regions and the highly doped second contact regions.

13. The method of claim 10, wherein the semiconductor body has a dopant concentration in the range of about 5E16 cm$^{-3}$ to 5E17 cm$^{-3}$.

14. The method of claim 10, further comprising forming a further conductor layer, insulated from and overlying part of the substantially parallel, spaced-apart regions and portions.

15. The method of claim 14, further comprising electrically coupling the further conductor layer to the first or second conductor layer.

16. The method of claim 10, wherein the first conductivity type is P type and the second, opposite conductivity type is N type.

17. A semiconductor device, comprising:
multiple parallel relatively lightly doped semiconductor regions of first conductivity type in an alternating arrangement with multiple parallel relatively lightly doped semiconductor regions of a second, opposite, conductivity type, adapted to form one or more superjunctions therein, wherein the multiple parallel regions have co-planar first ends and opposed, co-planar second ends;
relatively highly doped layers of the first conductivity type terminating the first ends of the multiple parallel regions of the first conductivity type;
relatively highly doped layers of the second, opposite, conductivity type terminating the second ends of the multiple parallel regions of the second conductivity type;
a first conductive layer on the first ends and in direct contact with the relatively highly doped layers of the first conductivity type and the relatively lightly doped regions of the second, opposite conductivity type, forming ohmic contacts with the relatively highly doped layers of the first conductivity type and Schottky contacts with the relatively lightly doped regions of the second, opposite conductivity type; and
a second conductive layer on the second ends and in direct contact with the relatively highly doped layers of the second, opposite, conductivity type and the relatively lightly doped regions of the first conductivity type, forming ohmic contacts with the relatively highly doped layers of the second, opposite, conductivity type and Schottky contacts with the relatively lightly doped regions of the first conductivity type, wherein the relatively highly doped layers of the first conductivity type and the relatively highly doped layers of the second, opposite, conductivity type each are adapted to carry forward current when the semiconductor device is in forward conduction.

18. The semiconductor device of claim 17, wherein the multiple parallel relatively lightly doped alternating regions of first and second, opposite, conductivity types, have impurity concentrations in the range of about 5E16 cm$^{-3}$ to 5E17 cm$^{-3}$.

19. The semiconductor device of claim 17, further comprising a region of the same conductivity type and doping intermediate to that of the relatively lightly doped regions and the relatively heavily doped layers, interspersed between the relatively lightly doped regions and the relatively heavily doped layers.

20. The semiconductor device of claim 17 wherein the semiconductor comprises silicon and the first and second conductive layers comprise silicide.

* * * * *